United States Patent
Smith et al.

(10) Patent No.: US 10,714,391 B2
(45) Date of Patent: Jul. 14, 2020

(54) METHOD FOR CONTROLLING TRANSISTOR DELAY OF NANOWIRE OR NANOSHEET TRANSISTOR DEVICES

(71) Applicant: Tokyo Electron Limited, Tokyo (JP)

(72) Inventors: Jeffrey Smith, Clifton Park, NY (US); Subhadeep Kal, Albany, NY (US); Anton Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/204,605

(22) Filed: Nov. 29, 2018

(65) Prior Publication Data

US 2019/0172751 A1 Jun. 6, 2019

Related U.S. Application Data

(60) Provisional application No. 62/594,352, filed on Dec. 4, 2017.

(51) Int. Cl.
*H01L 27/12* (2006.01)
*H01L 21/822* (2006.01)
(Continued)

(52) U.S. Cl.
CPC ........ *H01L 21/8221* (2013.01); *H01L 21/308* (2013.01); *H01L 21/30604* (2013.01);
(Continued)

(58) Field of Classification Search
CPC ............. H01L 21/8221; H01L 29/1033; H01L 21/823807; H01L 29/0649; H01L 29/161;
(Continued)

(56) References Cited

U.S. PATENT DOCUMENTS 7,374,986 B2 * 5/2008 Kim ................. H01L 29/42392
257/210
9,012,284 B2 4/2015 Glass et al.
(Continued)

FOREIGN PATENT DOCUMENTS

JP     2011-29503 A   2/2011
KR  10-2017-0083822 A   7/2017
(Continued)

OTHER PUBLICATIONS

International Search Report and Written Opinion dated Mar. 22, 2019 in PCT/US2018/063623, 10 pages.

*Primary Examiner* — Vu A Vu
(74) *Attorney, Agent, or Firm* — Oblon, McClelland, Maier & Neustadt, L.L.P.

(57) ABSTRACT

A method of manufacturing a semiconductor device includes: providing a substrate including a first stacked fin structure for forming a channel of a first gate-all-around (GAA) transistor, the first stacked fin structure including an initial volume of first channel material, and a second stacked fin structure for forming a channel of a second GAA transistor, the second stacked fin structure including an initial volume of second channel material; reducing said initial volume of the second channel material relative to the initial volume of first channel material by a predetermined amount corresponding to a delay of the first GAA transistor; and forming first and second GAA gate structures around said first channel material and said second channel material respectively.

16 Claims, 12 Drawing Sheets

(51) Int. Cl.
*H01L 21/8238* (2006.01)
*H01L 29/423* (2006.01)
*H01L 21/308* (2006.01)
*H01L 21/306* (2006.01)
*H01L 27/092* (2006.01)
*H01L 29/06* (2006.01)
*H01L 29/161* (2006.01)
*H01L 29/10* (2006.01)
*H01L 29/786* (2006.01)
*H01L 27/06* (2006.01)

(52) U.S. Cl.
CPC ........ *H01L 21/823807* (2013.01); *H01L 21/823821* (2013.01); *H01L 21/823828* (2013.01); *H01L 27/0688* (2013.01); *H01L 27/092* (2013.01); *H01L 27/0924* (2013.01); *H01L 29/0649* (2013.01); *H01L 29/0673* (2013.01); *H01L 29/1033* (2013.01); *H01L 29/161* (2013.01); *H01L 29/42392* (2013.01); *H01L 29/78696* (2013.01)

(58) Field of Classification Search
CPC ........... H01L 29/0673; H01L 27/0924; H01L 21/823828; H01L 21/30604; H01L 21/308; H01L 29/42392; H01L 21/823821; H01L 29/78696

USPC ........................................ 257/351
See application file for complete search history.

(56) References Cited

U.S. PATENT DOCUMENTS

| | | | |
|---|---|---|---|
| 9,219,119 B2* | 12/2015 | Sun | ........ H01L 21/823412 |
| 9,224,810 B2* | 12/2015 | Kim | ........ H01L 27/092 |
| 9,343,559 B2 | 5/2016 | Glass et al. | |
| 9,583,491 B2 | 2/2017 | Kim et al. | |
| 9,812,524 B2 | 11/2017 | Glass et al. | |
| 9,899,416 B2 | 2/2018 | Kim et al. | |
| 9,991,261 B2 | 6/2018 | Mitard | |
| 2013/0161756 A1 | 6/2013 | Glass et al. | |
| 2014/0197377 A1 | 7/2014 | Kim et al. | |
| 2015/0228772 A1 | 8/2015 | Glass et al. | |
| 2016/0086951 A1 | 3/2016 | Kim et al. | |
| 2016/0260802 A1 | 9/2016 | Glass et al. | |
| 2017/0040321 A1 | 2/2017 | Mitard | |
| 2017/0133277 A1 | 5/2017 | Kim et al. | |
| 2017/0170268 A1* | 6/2017 | Song | ........ H01L 29/0673 |
| 2017/0200738 A1 | 7/2017 | Kim et al. | |
| 2018/0158836 A1 | 6/2018 | Kim et al. | |

FOREIGN PATENT DOCUMENTS

| | | |
|---|---|---|
| KR | 10-2017-0097322 A | 8/2017 |
| WO | WO 2014/018201 A1 | 1/2014 |

* cited by examiner

METHOD FOR CONTROLLING TRANSISTOR DELAY OF NANOWIRE OR NANOSHEET TRANSISTOR DEVICES

INCORPORATION BY REFERENCE

This present disclosure claims the benefit of U.S. Provisional Application No. 62/594,352, "Method for Controlling Transistor Delay and for Balancing of NMOS and PMOS Nanowires on Nanosheets in Transistor Devices" filed on Dec. 4, 2017, which is incorporated herein by reference in its entirety.

FIELD OF THE INVENTION

The present disclosure relates to a method of manufacturing a semiconductor device such as an integrated circuit, and transistors and transistor components for an integrated circuit.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

During manufacture of a semiconductor device, various fabrication processes are executed such as film-forming depositions, etch mask creation, patterning, photoresist development, material etching and removal, as well as doping treatments. These processes are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which devices, transistors, and standard cells are stacked on top of each other as a means to continue scaling. Fabrication of 3D semiconductor devices poses many new and unique challenges associated with new process integrations, novel hardware and process capability, design, post-fabrication processing, electronic design automation, as well as other aspects of the 3D fabrication process.

SUMMARY

In an embodiment, a method of manufacturing a semiconductor device includes: providing a substrate including a first stacked fin structure for forming a channel of a first gate-all-around (GAA) transistor, the first stacked fin structure comprising an initial volume of first channel material provided between upper and lower portions of first sacrificial material such that the first channel material and first sacrificial material are exposed at a side of the first stacked fin structure, and a second stacked fin structure for forming a channel of a second GAA transistor, the second stacked fin structure comprising an initial volume of second channel material provided between upper and lower portions of second sacrificial material such that the second channel material and second sacrificial material are exposed at a side of the second stacked fin structure; reducing said initial volume of the second channel material relative to the initial volume of first channel material by a predetermined amount corresponding to a delay of the first GAA transistor; and forming first and second GAA gate structures around said first channel material and said second channel material respectively.

In another embodiment, A semiconductor device includes: a substrate having a planar surface; a first gate-all-around field effect transistor (GAA-FET) provided on said substrate and comprising a first channel having an untrimmed volume of first channel material corresponding to a volume of the first channel material within a first stacked fin structure from which the first channel was formed; and a second GAA-FET provided on said substrate and comprising a second channel having a trimmed volume of second channel material which is less than said untrimmed volume of first channel material by a predetermined trim amount corresponding to a delay adjustment of the second GAA-FET relative to the first GAA-FET, wherein said first and second GAA FETs are electrically connected as complementary FETs.

In another embodiment, a method of manufacturing a semiconductor device includes: providing a substrate including a first stacked fin structure for forming a channel of a first gate-all-around (GAA) transistor, the first stacked fin structure comprising an initial volume of first channel material provided between upper and lower portions of first sacrificial material such that the first channel material and first sacrificial material are exposed at a side of the first stacked fin structure, and a second stacked fin structure for forming a channel of a second GAA transistor, the second stacked fin structure comprising an initial volume of second channel material provided between upper and lower portions of second sacrificial material such that the second channel material and second sacrificial material are exposed at a side of the second stacked fin structure; reducing said initial volume of the second channel material relative to the initial volume of first channel material by a predetermined amount corresponding to a threshold voltage of the first GAA transistor; and forming first and second GAA gate structures around said first channel material and said second channel material respectively Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
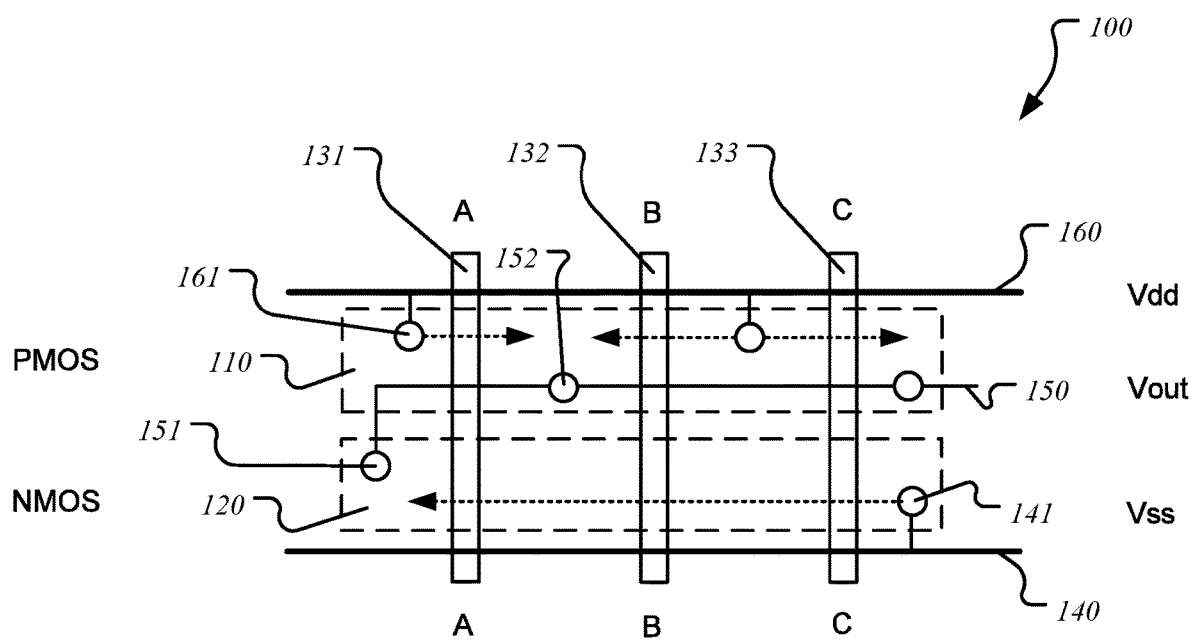
FIG. 1 shows an example layout of a three-input NAND circuit according to an embodiment of the disclosure.

The order of discussion of the steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Referring now to the drawings, wherein like reference numerals designate identical or corresponding parts throughout several views, the following description relates to a system, apparatus, and associated methodology for balancing transistor delay in transistor devices via myriad etching techniques.

Certain types of transistor devices use N-type metal-oxide-semiconductor (NMOS) as well as P-type metal-oxide-semiconductor (PMOS) in a complementary manner. NMOS devices are based on the mobility of electrons, which can be several times faster compared to the mobility of holes, which are the basis of PMOS devices. Methods have been developed to address this mismatch via inducing strain on the PMOS channel in order to increase the mobility in the PMOS device, or by changing channel material of the PMOS device directly from silicon to silicon germanium. There are several additional factors such as materials, layout, scale, etc. that affect transistor delay in field effect transistors (FETs). For example, delay associated with NMOS to PMOS balancing within a FET device can also be the result of having a mismatch between the number of transistors between supply from a power rail to an output line in either the NMOS or PMOS active area as compared to the complementary active area. An example of this is shown in FIG. 1 for the case of a three-input NAND circuit layout 100 including an active PMOS area 110 and an active NMOS area 120. As seen, the layout 100 includes gate regions 131, 132, and 133, each of which provide a common gate input (A, B or C) to a complementary pair of transistors.

A supply from a Vss rail 140 that enters a Vss node 141 in the NMOS active area 120 will cross three transistors before reaching a Vout terminal 150 at Vout node 151 as seen by the dashed arrow in the NMOS active area 120. Meanwhile, the supply for Vdd can be split into two separate points in the 3-inout NAND device, such that for a supply from a Vdd rail 160 in the PMOS active area 110, only a single transistor is required to be crossed in order to reach a Vout terminal 152. For example, a supply from Vdd rail 160 that enters node 161 will cross a single transistor before reaching a Vout node 152 as seen by the dashed arrow in the PMOS active area 110 (three different paths shown). Thus, a delay is introduced for the NMOS active area 120 due to the three-fold increase in the number of transistors that need to be crossed compared to the PMOS active area 110. In some cell designs, such imbalances in the number of transistors between active areas result in a delay effect, especially when output through a given transistor is then supplied as input to another transistor in a given cell design.

Such imbalances can be addressed by increasing the number of fin structures in an active area as a proportion of the transistor imbalance. Considering the three-input NAND cell as an example, an NMOS active area would use three fin structures for every one fin structure in the corresponding PMOS active area. This technique may be used for fin field effect transistor (FinFET) processing in which the device channel is the fin structure itself, and nanowire or nanosheet processing in which the device channel is made up of one or more discrete nanostructures provided from a base fin structure. This approach is very straight-forward in such 2D designs and simply involves the removal of fin structures, either during the initial fin patterning process (typically via self-aligned quad patterning (SAQP) with fin cut (fin removal) executed at the beginning, middle, or end of the patterning process) or after the fin has been transferred into bulk silicon. For example, with such 2D designs, device channels are separated in the xy-plane which is typically the working surface of a substrate (e.g. a wafer). Etch systems can directionally etch perpendicular to the working surface of the substrate (z-plane) and thus laterally-spaced fins or channels can be blocked or cut using an etch mask as long as the desired resolution can be reached. Such directional etch techniques are not suitable when transistor channels are vertically stacked on top of one another.

For the case of vertically-stacked nanowires and/or nanosheets, and for the case of complementary field effective transistor devices (CFET) in 3D configurations, balancing NMOS and PMOS channel counts is more challenging because channels do not exists as isolated entities that can be simply cut from the device during subsequent patterning steps.

With such 3D circuits, the nanowires or nanosheets can be stacked overtop one another with a very finite distance between the vertically-stacked nanowires or nanosheets (similar to the structure of FIG. 2 described below). This separation distance can be on the order of below 10 nm. Accordingly, removing individual nanowires or nanosheets in the 3D circuit can include positioning a cutting medium, such as a deposited film that has been planarized and recessed down, extremely accurately with small error tolerances. Such planarization and recessing needs a relatively high precision between the vertically-stacked nanowires or nanosheets across the entire wafer. The present inventors recognized that capability to do such placement of a film within a complex topology is challenging even if a bottom-up selectively deposited film deposition process is used.

As another option, the nanowires or nanosheets can be paired with one another. For example, instead of having four stacked PMOS or NMOS nanowire or nanosheet channels vertically stacked within a common originating fin structure, a fin count is doubled so that two stacked wires exist on each fin structure. This technique provides some margin for using the simple fin cutting techniques described above to accommodate transistor balancing. One drawback of this technique is that there is an additional fin pitch to be incorporated into a given cell height. Moreover, the delay can only be handled through removing pairs of channels as opposed to removing single channels, as would be required for the case of a three-input NAND cell. More generally, balancing by complete removal of even a single channel is limited to discrete adjustment values based on the delay associated with the entire channel.

Challenges increase for the case of complementary field effect transistor (CFET) devices that include PMOS or NMOS channels (nanowires or nanosheets) vertically stacked over their complement channels. In this configuration, pairing originating fin structures is no longer valid for the case of CFET as this would remove both NMOS and PMOS channels within a single base fin structure.

Techniques herein provide methods of enabling transistor balance of such 3D CFET devices and other CFET devices. Techniques herein provide balancing by using etch-selective trimming of the PMOS channel and NMOS channel materials rather than complete removal of a channel. For the case of a three-input NAND cell, instead of driving three NMOS nanowire channels and a single PMOS nanowire channel, originating fin counts can contain all three nanowires for both NMOS and PMOS. This technique can include a method in which the PMOS channel is "trimmed" such that the capacitive effects of the remaining channel would correct for the transistor imbalance. Hence, in this example, the PMOS wires can be trimmed relative to the size of the NMOS wires to correct for this imbalance or to create a desired balance.

Figure 2A:
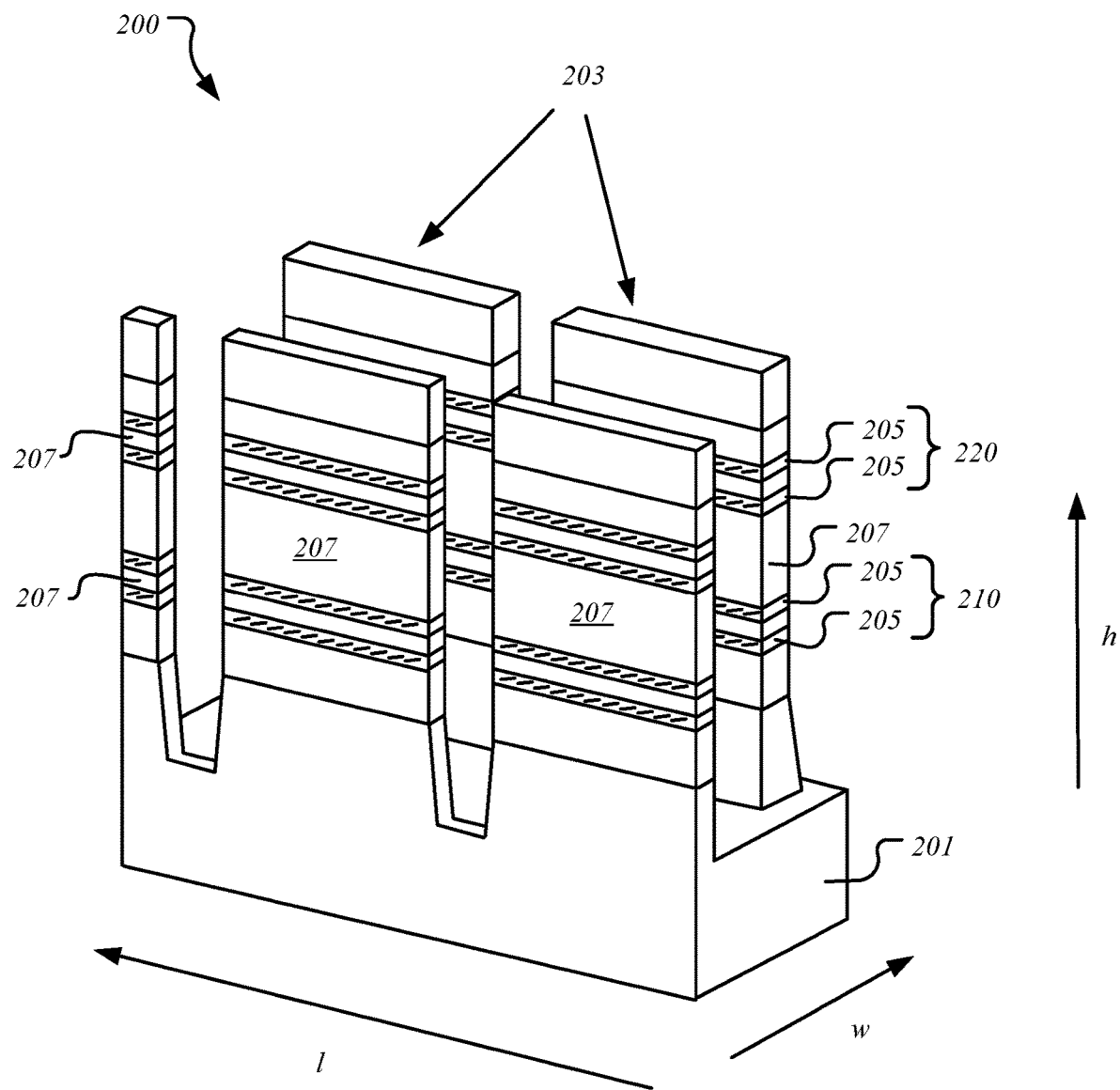
FIG. 2A shows an isometric view of a nanowire/nanosheet FET structure according to an embodiment of the disclosure.

FIG. 2A shows an example structure to which techniques of the present disclosure may be provided. As seen, the structure 200 includes a substrate 201 having base fin structures 203 thereon. Each base fin structure 203 includes alternating layers of channel material 205 and sacrificial material 207 stacked in a height direction h within the base fin 203. The base fin structures 203 are spaced laterally along a width direction w of the substrate 201, as well as along the length direction l. Each base fin structure 203 can be used to form one or more first gate-all-around (GAA) transistors. In the example structure of FIG. 2A, base fin structures 203 each include a first stacked fin structure 210 for forming a channel region of a first GAA transistor, and a second stacked fin structure 220 for forming a channel region of a second GAA transistor. The first and second stacked fin structures 210, 220 each include an initial volume of channel material 205 provided between lower and upper portions of sacrificial material 207. While the stacked fin structures 210, 220 are each shown to include two layers of channel material 205, only a single layer may be used. The lower stacked fin structure 210 may be used to provide an NMOS device for example, while the upper stacked fin structure 220 may be used to form a PMOS device as discussed further below.

Figure 2B:
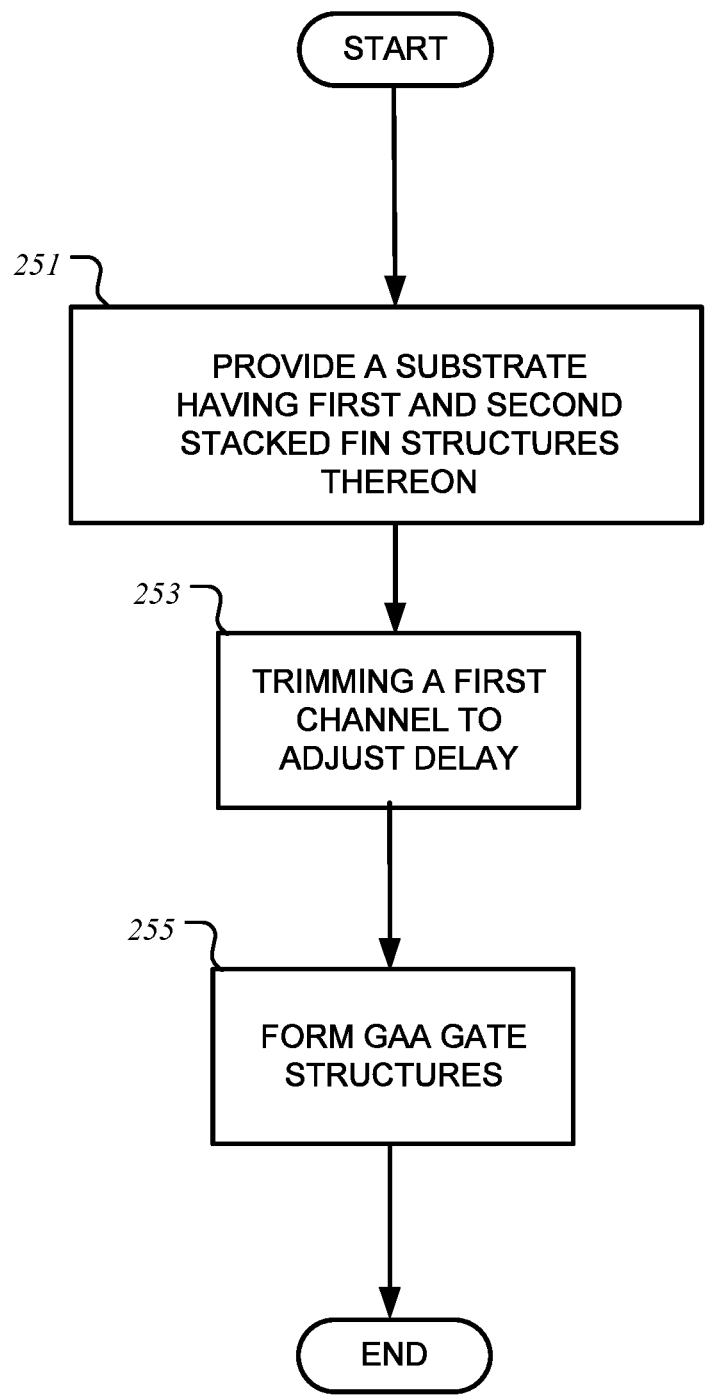
FIG. 2B shows a process flow of a method of manufacturing a semiconductor device.

FIG. 2B shows a process flow for a method of manufacturing a semiconductor device As seen, the process includes step 251 of providing a semiconductor substrate having first and second stacked fin structures 210, 220 thereon. Such stacked fin structures 210, 220 may be provided within a single base fin or provided in separate fins laterally separated from each other on the substrate. The first stacked fin structure 210 is used for forming a channel of a first gate-all-around (GAA) transistor, and the second stacked fin structure 220 is used for forming a channel of a second GAA transistor. The first stacked fin structure 210 includes an initial volume of first channel material 205 provided between upper and lower portions of first sacrificial material 207 such that the first channel material and first sacrificial material are exposed at a side of the first stacked fin structure 210. The second stacked fin structure 220 includes an initial volume of second channel material 205 provided between upper and lower portions of second sacrificial material 207 such that the second channel material 205 and second sacrificial material 207 are exposed at a side of the second stacked fin structure 220.

In step 253, the initial volume of the second channel material 205 is reduced relative to the initial volume of first channel material 205 by a predetermined amount. Such reduction may be performed by etch "trimming" a portion of the initial volume of channel material. The predetermined amount of volume reduction corresponds to a delay of the first GAA transistor. Thus, reduction permits adjustment of the transistor delay for the first GAA transistor, and can permit balancing delay among the first and second GAA transistors.

In step 255, first and second GAA gate structures are formed around the first channel material 205 and the second channel material 205 respectively. More specifically, the first and second sacrificial materials 207 are removed to "release" the first and second channel materials 205. GAA gate structures are then formed around each of the released channel materials. The first and second GAA structures may be electrically connected such that they are complimentary to each other. Therefore, reduction of one of the channel materials from its initial volume can be used to balance delay in complementary devices.

In one embodiment, the balancing technique by trimming can be applied to 2D designs where active regions are provided within in laterally spaced base fin structures. In one embodiment, a first active area includes a first type of transistor, for example NMOS, and a second active area includes a second type of transistor, for example PMOS. The first active area includes at least one fin structure that includes a first type of channel, for example an NMOS channel. The second active area includes at least one fin structure that includes a second type of channel, for example a PMOS channel. These channels may be a single nanowire or nanosheet channel, or multiple nanostructures formed from a single base fin structure. The selective trimming of the NMOS or PMOS channels with such 2D designs is straightforward because each set of wires exists within their unique active areas (i.e. base fins). As such, a masking pattern can be deposited before executing an etch such that one active area, for example the NMOS active area with the NMOS channels, are not etched, while the second active area, for example the PMOS active area with the PMOS channels, are affected by the etch. Thus, transistor delay can be balanced via "trimming" of the PMOS channels rather than complete removal of a base fin structure and all channels associated with it.

For the embodiment of CFET devices in which NMOS and PMOS channels are on a same base fin structure, the approach becomes more challenging. There are multiple techniques herein, however, that can be used to selectively trim NMOS and PMOS within the same originating fin structures. For example, the present inventors recognized that although NMOS and PMOS channels are provided on the same base fin structure, there is some measure of tolerance in the vertical position of the NMOS and PMOS channels such that greater than 10 nm separation can exist at the vertical (z-plane) border between the NMOS and PMOS channels. This greater separation can facilitate a material fill, followed by planarization (CMP) and then recessing down to open NMOS or PMOS selective to its complement.

In another embodiment, different channel materials are used between NMOS and PMOS, and the bulk originating fin structure can be composed of an epitaxially grown film that has selectivity to both intended channel materials of NMOS and PMOS in order to increase the mobility of the holes in the PMOS region. An example of this embodiment incorporates SiGe as PMOS channel material, Si as NMOS channel material, and then a specific type of doped silicon as the fin non-channel material which will eventually be removed in the wire release process. In this embodiment, at least two channel materials are used that have different etch properties wherein a first channel material can be etched without etching (removing) a second channel material or a third bulk fin channel material.

The proposed method of utilizing selective trimming of either the NMOS or PMOS channels not only applies to controlling transistor delay, but also can be used to control threshold voltage (Vt). Typically, Vt is tuned through setting different work function metal thicknesses on the channel. In typical FINFET or gate-all-around (GAA) devices, this is often achieved through depositing a predetermined amount of work function metal across all channels, and then utilizing a complex set of blocking masks which can be used to open selected transistors in order to etch-back the predetermined amount of work function metal on the transistors to be tuned. For 3D architectures, such as complimentary FET (CFET) in which the NMOS and PMOS devices are stacked overtop one another, such a method of Vt tuning can be complex to perform. This method may pose a way of tuning Vt for 3D logic devices in which the initial channel widths can be adjusted to control Vt as opposed to changing the thickness of the work function metal only.

Techniques herein enable changing electrical delay or Vt in semiconductor channel materials by changing a volume of the channel material(s). Processes herein enable shrinking one or more layers of channel materials within a fin structure to result in a smaller volume or smaller cross-sectional volume of a segment of channel material. Fin structures can be formed by depositing various different layers to create a desired fin stack. This can include multiple layers of a first channel material formed on top of multiple layers of a second channel material. Each layer of channel material can be separated by sacrificial material such as a bulk material or carrier material. After a layer stack is formed, an etch mask can be formed thereon and used to anisotropically transfer the pattern through the stack of materials thereby creating fin structures (lines of material with multiple different layers). Using one etch mask results in each layer having essentially a same initial volume. For some designs, it can be beneficial to shrink some of the channel materials to result in a changed (reduced) volume which in turn results in a different electrical delay value or Vt. Accordingly different types of materials (NMOS and PMOS) can be stacked on top of each other and formed with an initial, same volume, and then be selectively shrunk to change a volume of channel materials to result in a desired delay or Vt for each type of material.

Figure 3:
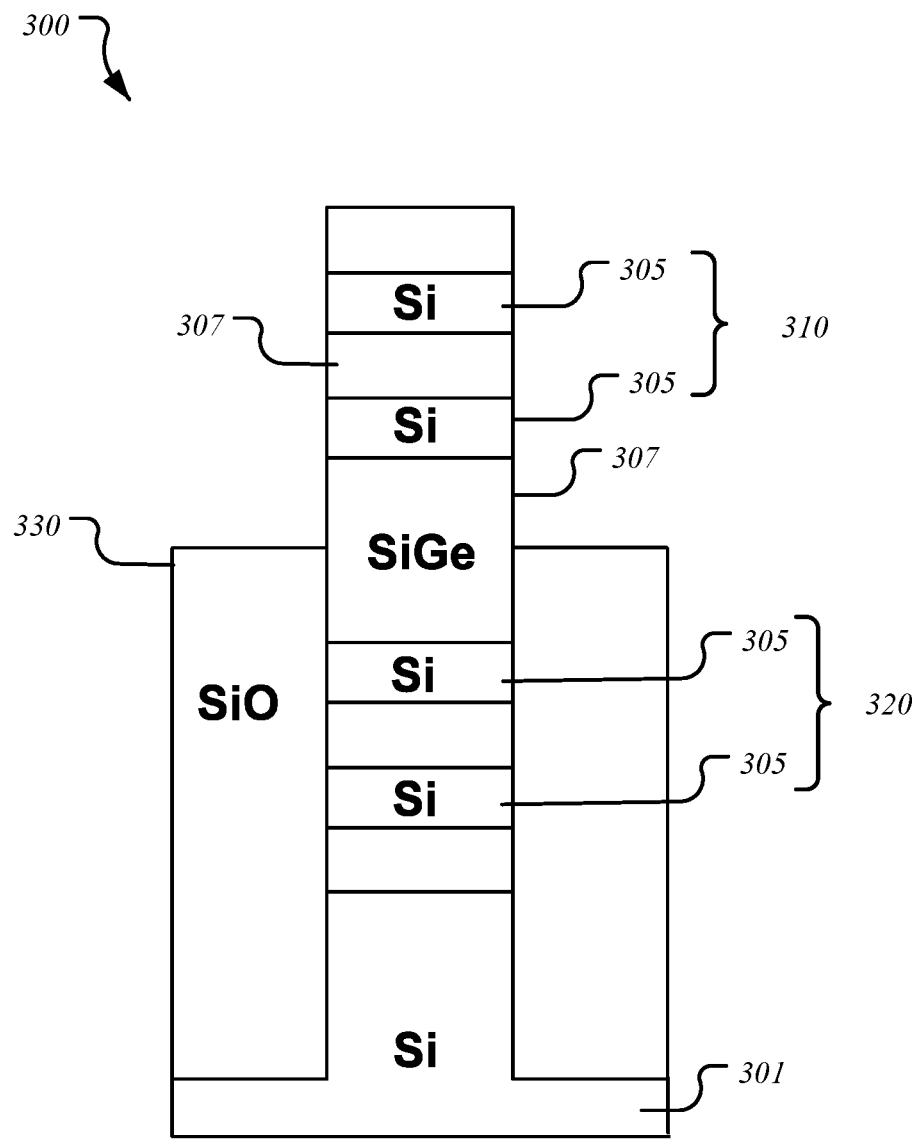
FIG. 3 shows a cross-sectional view of a fin structure with mask material protecting a set of channels according to an embodiment of the disclosure.

Returning to the example of FIG. 2B, FIG. 3 illustrates a stacked fin structure 300. The stacked fin structure 300 may provide a target NMOS region 310 and a target PMOS region 320 having a plurality of channels 305. The plurality of channels 305 can be nanowires or nanosheets. In one embodiment, the target NMOS region 310 or PMOS region 320 active area can be protected via a blocking mask while keeping the complement exposed in order to be etched. With the complement protected, exposed nanowires or nanosheets can be etched. Such re-sizing can be executed via an etch-selective trim. Such etch selective trim can be an isotropic, vapor-phase trim or chemical oxide removal (COR). Uncovered channel material is laterally trimmed while being protected on the upper and lower surfaces of the channel by a non-channel bulk fin material 307. For example, for the case of the NMOS region 310, Si is selected as channel material and SiGe as the bulk fin material 307. With such selections and configuration, an etch process can selectively laterally recess a width of the channel 305 with very high selectivity to the SiGe bulk fin material 307 (no etching of SiGe or no significant etching of SiGe) to adjust a width of the NMOS region 310. Thus NMOS 310 and PMOS 320 regions are balanced without individual channel removal, and are balanced instead by adjusting a total volume or area of the cumulative channel materials running through an active area. As discussed above, it becomes difficult to remove individual layers within a common base fin structure 303 because gaps between individual nanowires or nanosheets can be less than 10 nm and the process of placing a covering or blocking film to protect any desired kept-wires with good tolerance to expose the channels 305 (nanowires or nanosheets) targeted for etching can be very difficult with current processing (e.g. material deposition, CMP, recess etching). Thus, in one embodiment, a relatively larger separation can be created between the NMOS 310 and PMOS 320 regions.

FIG. 3 illustrates stacked fin structure 300 in which a separation is sufficient to enable use of a fill material 330, for example a dielectric fill material, followed by CMP, followed by a recess to protect or expose one set of channels 305 from another. For example, the dielectric fill 330 material can include SiO. In the example of FIG. 3, the NMOS region 310 and PMOS region 320 each include Si channels 305. That is, channel materials of the NMOS and PMOS regions have a same chemical composition. The dielectric fill 330 has been recessed sufficiently to expose a channel 305 in the NMOS region 310 in an upper portion of the stacked fin structure 300. A selective etch is then executed to laterally trim the exposed channel 305 material. For example, an isotropic, vapor-phase etch can be executed. Such vapor phase etching can have etch selectivity of 100:1 to other epitaxially grown crystal films used in a corresponding fin composition, such as SiGe or doped Si. In this embodiment, the NMOS region 310 channel 305 material can then be trimmed with PMOS region 320 channel 305 material being protected from etching by the fill material 330. The etch changes a profile of the NMOS region 310 channel 305 material that is exposed, wherein a cross-section or volume of the channel 305 is reduced.

In one embodiment, the NMOS region 310 channel 305 material can be protected from etching by depositing fill material 330 on the top of the stacked fin structure 300 without covering the PMOS region 320 channel 305 material. For example, the fill material 330 can be selectively deposited towards the top of the stacked fin structure 300 by an angled evaporation method. A plurality of mask fins can be fabricated adjacent to the stacked fin structure 300 in order to provide a mask when exposed to the angled evaporation, wherein the plurality of mask fins prevent deposition of the fill material 330 in the shadows of the plurality of mask fins. For example, the angled evaporation method can be provided by glancing angle deposition (GLAD).

An amount of the channel 305 material trimmed can be based on electrical requirements or specifications to balance NMOS 310 and PMOS 320 regions and can be calculated based on expected transistor delay or Vt, wherein the expected transistor delay or Vt can be based on a localized area of a particular cell being tuned. Thus, an amount of etching can be based on a size of a corresponding cell, a layout of the cell, materials used, and the like. For example, etches can be tuned to the order of several Angstroms using a cyclic etch process. Other etch selective processes can be used such as atomic layer etching (ALE) etching and quasi-ALE. In this regard, such trimming can provide a fine degree of delay or Vt tuning that was not possible with balancing techniques that relied on complete removal of a channel as discussed above.

Figure 4:
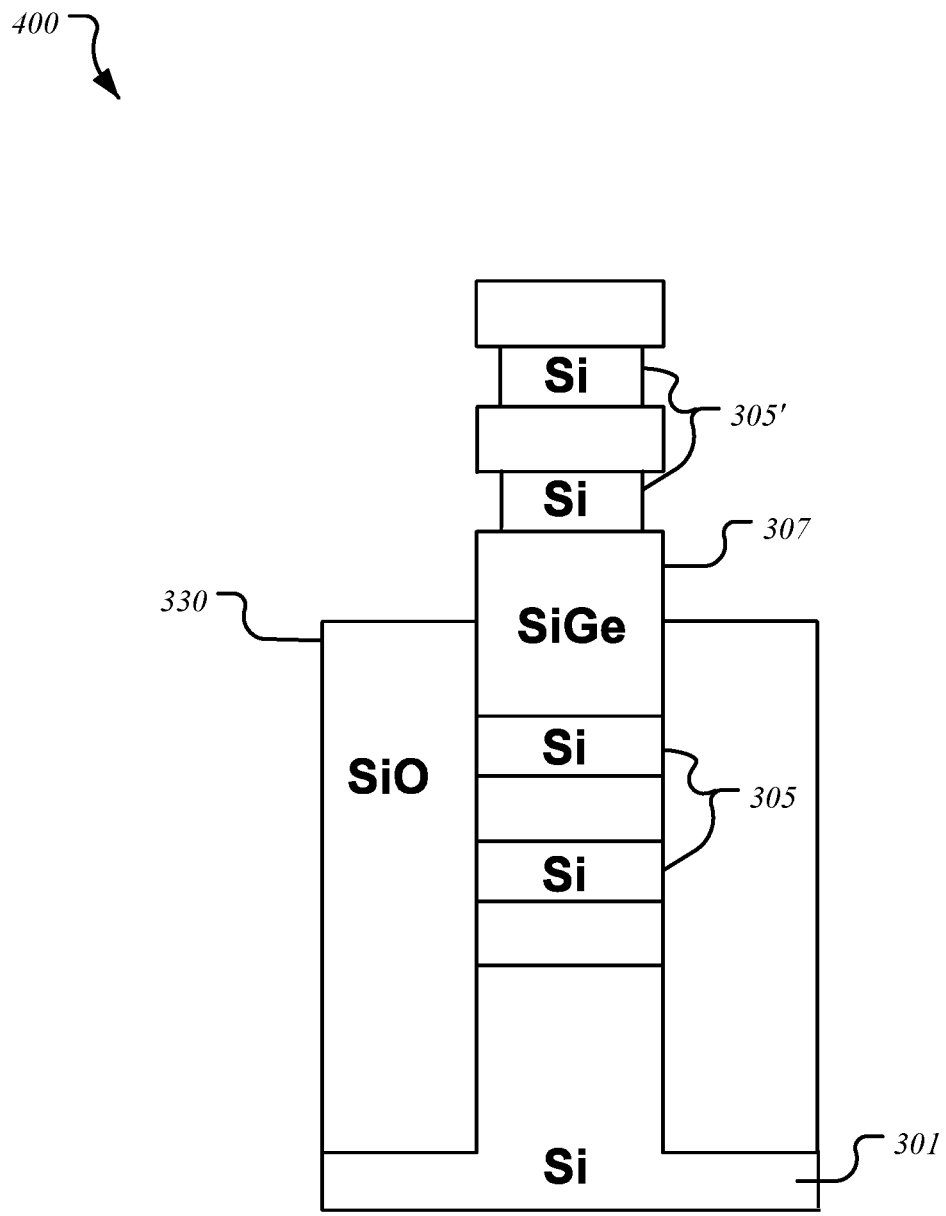
FIG. 4 shows a cross-sectional view of a fin structure including a top set of channels having been etched according to an embodiment of the disclosure.

FIG. 4 illustrates an example etched stacked fin structure 400 wherein the exposed NMOS region 310 has been etched and features a decreased width channel 305' (i.e. channel volume).

Figure 5:
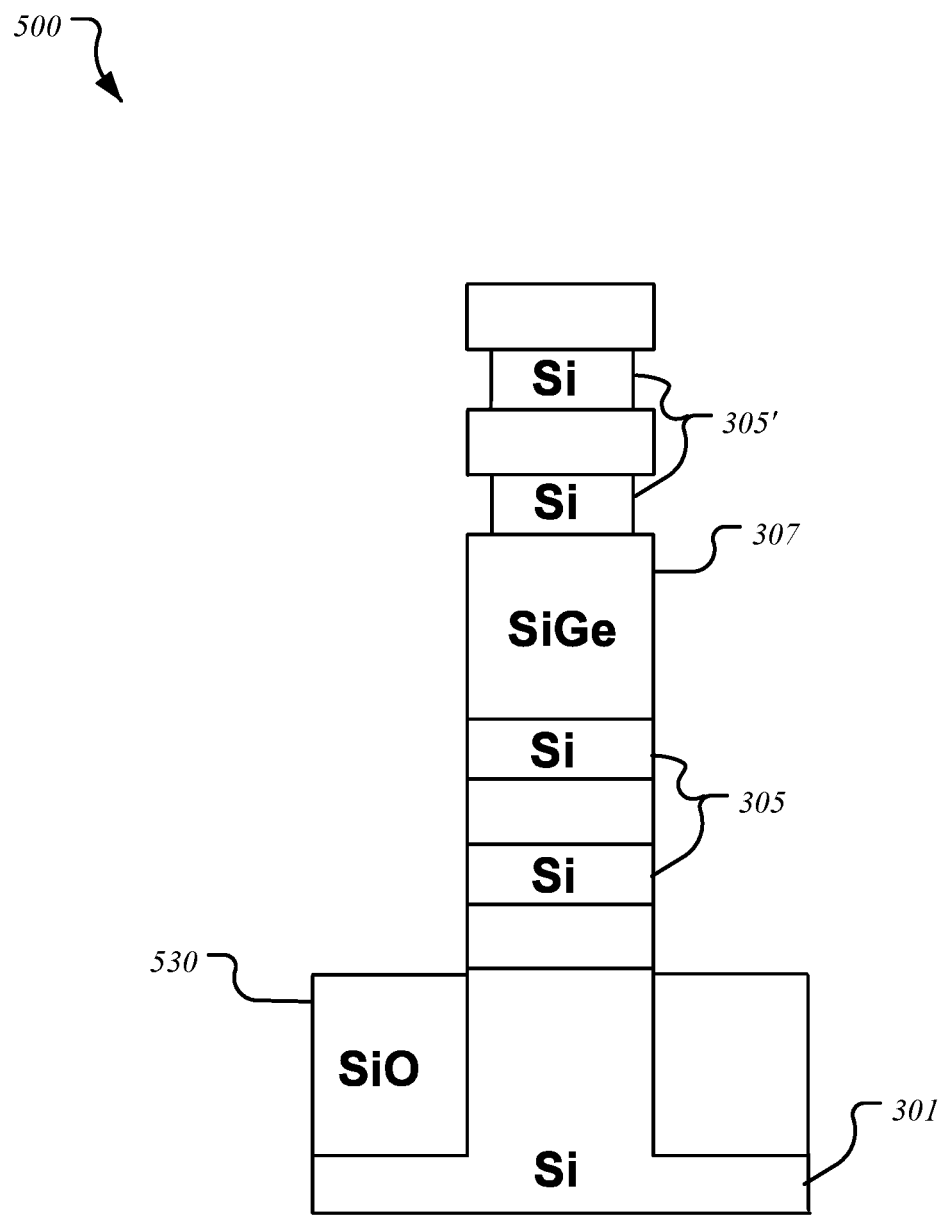
FIG. 5 shows a cross-sectional view of a fin structure including a top set of channels having been etched and a mask material having been recessed according to an embodiment of the disclosure.

Subsequent to the trim etch with block fill, remaining fill 330 can either be removed completely, or further recessed sufficiently to uncover underlying channel materials. FIG. 5 illustrates an example stacked fin structure 500 where the fill material 330 is further recessed to expose the PMOS 320 region, but leaving a shallow trench isolation (STI) portion 530 in place.

Figure 6:
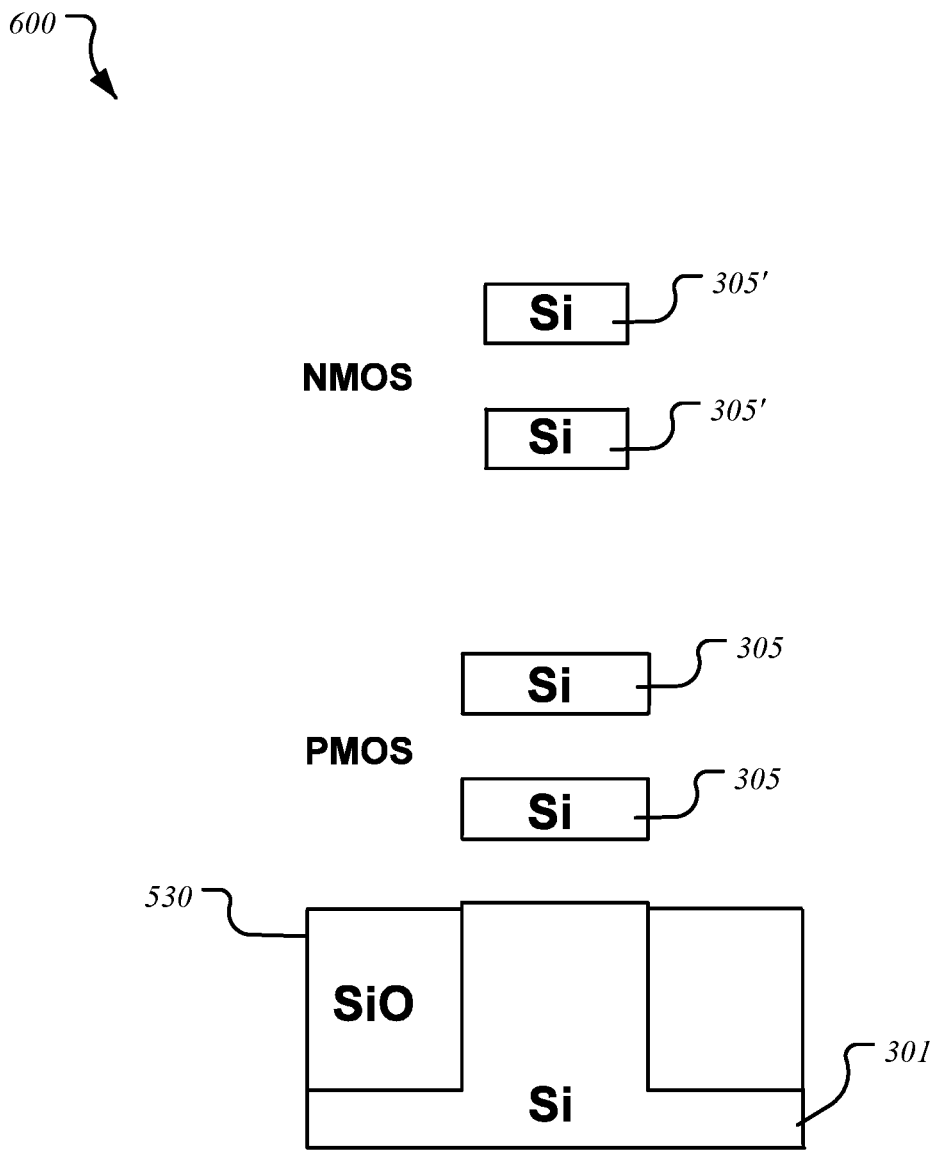
FIG. 6 shows a cross-sectional view of a fin structure wherein bulk fin material has been removed according to an embodiment of the disclosure.

Sacrificial bulk fin material 307, for example SiGe, can then be removed for a particular region, cell, etc. FIG. 6 shows an example result of removing SiGe bulk fin material 307 from a stacked fin structure to provide a structure 600 including vertically arranged NMOS 310 and PMOS 320 channel 305 and decreased width channel 305' portions.

Figure 7:
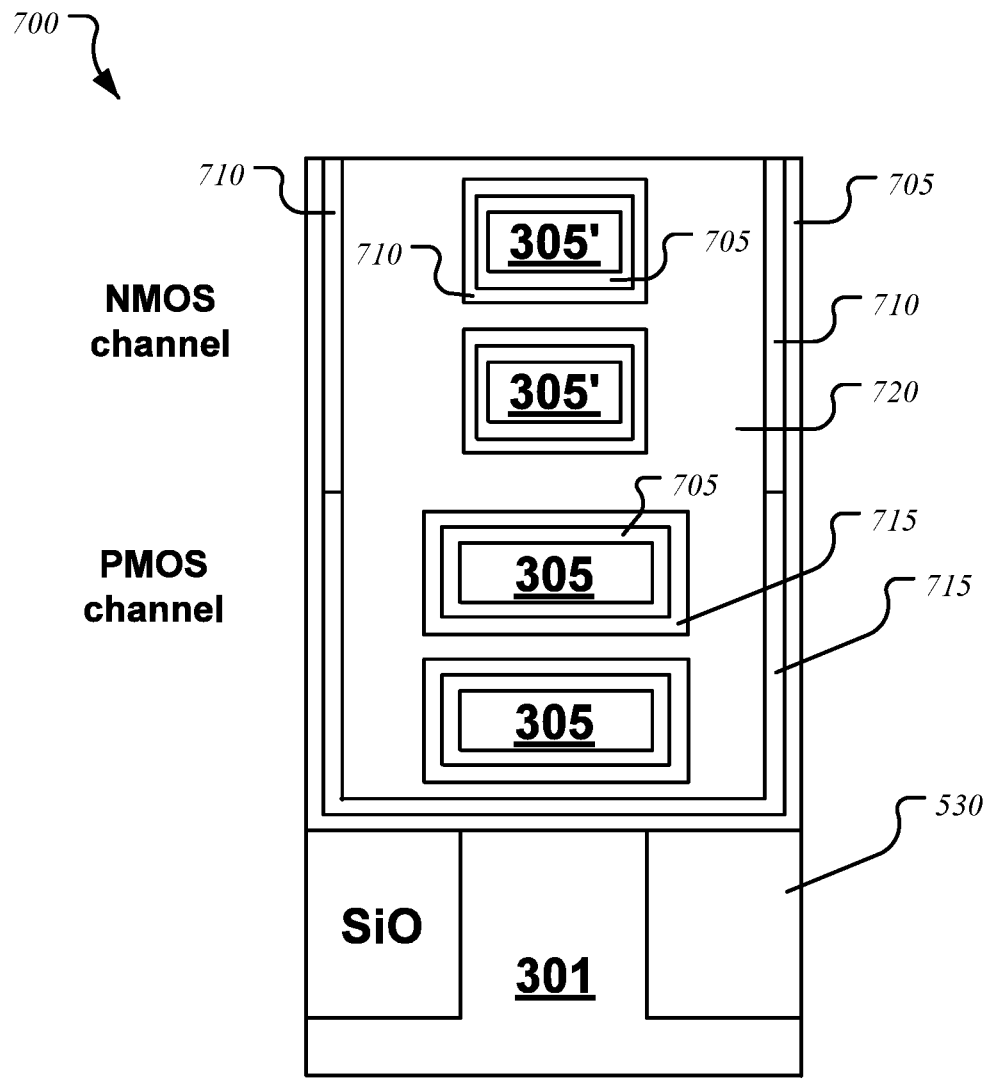
FIG. 7 shows a gate all around transistor device according to an embodiment of the disclosure.

As illustrated in FIG. 7, cell fabrication can continue with deposition of high-k dielectric 705, NMOS work-function metal 710, PMOS work-function metal 715, and gate fill metal 720, or other processes as specified for a particular fabrication scheme to create a gate all around (GAA) transistor device 700. In other words, a size of the channels 305 and decreased width channels 305' is varied to control delay induced by NMOS 310/PMOS 320 region imbalance. In this embodiment, PMOS 320 and NMOS 310 regions can be a same material; with one material blocked or covered, the other material can be resized.

Figure 8:
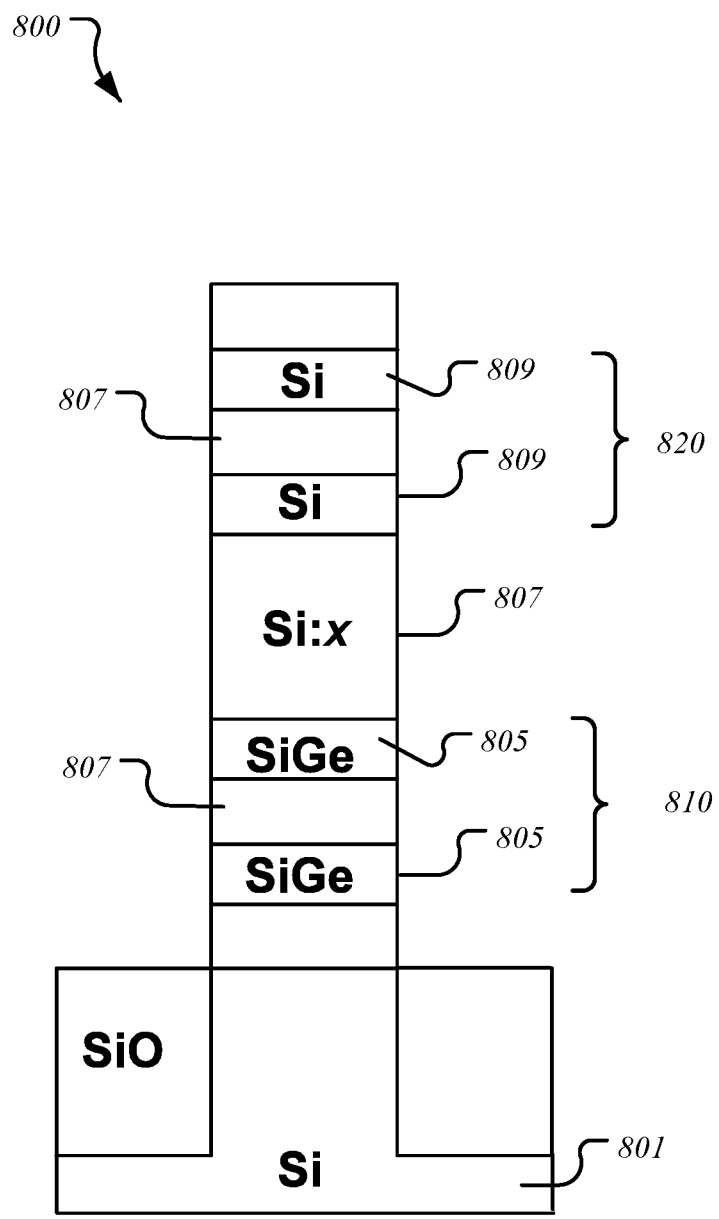
FIG. 8 shows a cross-sectional view of a fin structure with two different channel materials with mask material protecting a set of channels according to an embodiment of the disclosure.

In another embodiment, a size or volume of NMOS and PMOS channels can be varied by selective etching and using different channel materials. This size modification controls delay induced by NMOS/PMOS imbalances and provides for tuning of one or both channel types. For selective etching among different channels, multiple different materials must be used. As illustrated in FIG. 8, a base fin stack 800 includes a first stacked fin structure 810 having a first channel material 805, a second stacked fin structure 820 having a second channel material 809, and a sacrificial bulk fin material 807 on a substrate 801. For example, the bulk fin material 807 may be doped silicon Si:X, for example Si:B material. The first stacked fin structure 810 can be PMOS material and the second stacked fin structure 820 can be NMOS material. The first channel material 805 may be SiGe and the second channel material 809 may be Si, with the bulk fin material 807 being a third material. The first, second, and third materials have different etch resistivities for a particular etch process. The second stacked fin structure 820 can be disposed above the first stacked fin structure 810 with bulk fin material 807 separating both regions. There can be multiple channels of each type of channel. More specifically, different channel materials can be used for both first channel material 805 and second channel material 809. Note that this is non-limiting and many more materials and combinations can be selected. With materials of different etch resistivities, there is no need to cover or block one active channel type area because the etch resistivities themselves will protect complementary and bulk materials from being etched (etched significantly).

An etch process is executed that etches one material in the base fin stack 800 without etching other materials in the base fin stack 800. This etch process can include an isotropic etch to evenly etch exposed material in any direction. The base fin stack 800 can be a fin structure with alternating layers of material with different etch resistivities. As described above, a vapor-phase etch, chemical oxide removal etch, ALE or quasi-ALE etch can be executed. Accordingly, etching results in a lateral etch because sidewalls of the channels are exposed. This selective etch can laterally trim a portion of a given material that is etchable by the particular etchants and process conditions used (chemical compounds, chamber pressure, temperature, etc.).

In one embodiment, the etch process may selectively etch the second stacked fin structure 820 channel material 809 without significantly etching the first stacked fin structure 810 channel material 805, wherein the second stacked fin structure 820 may be stacked overtop the first stacked fin structure 810. In another embodiment, the etch process may selectively etch the first stacked fin structure 810 channel material 805 without significantly etching the second stacked fin structure 820 channel material 809, wherein the second stacked fin structure 820 may be stacked overtop the first stacked fin structure 810.

Figure 9:
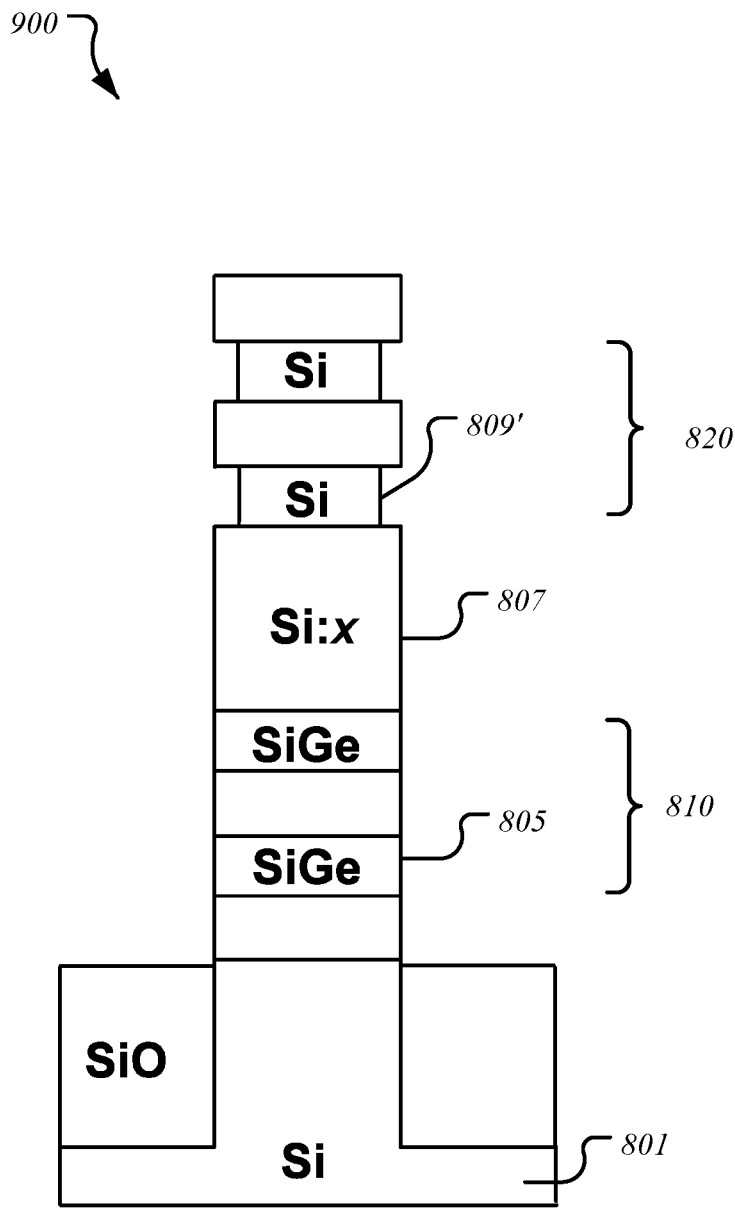
FIG. 9 shows a cross-sectional view of a fin structure with two different channel materials, wherein a top set of channels has been selectively etched an according to an embodiment of the disclosure.

FIG. 9 illustrates a result of an example a base fin stack 900 after a selective etch. Note that in this example, the second stacked fin structure 820 channel material 809' has been laterally etched a predetermined amount without etching the first stacked fin structure 810 channel material 805 or bulk fin sacrificial material 807.

After the first etch process, a second etch process can be used to trim the other complement channel material (if desired). Trimming the complementary channel material can be based on device design and layout of a circuit to create a desired transistor delay or to meet a transistor delay tolerance or Vt. Trimming the complementary channel material can be executed in situ in a given processing chamber by changing etch chemistry and etch process parameters. An amount of material trimmed can be based on electrical requirements or specifications to balance PMOS 810 and NMOS 820 regions in a vertically stacked configuration of channel materials. An amount to etch for a given channel material can be determined by calculations based on expected transistor delay or Vt based on a local area or region of a given cell being tuned for relay.

Figure 10:
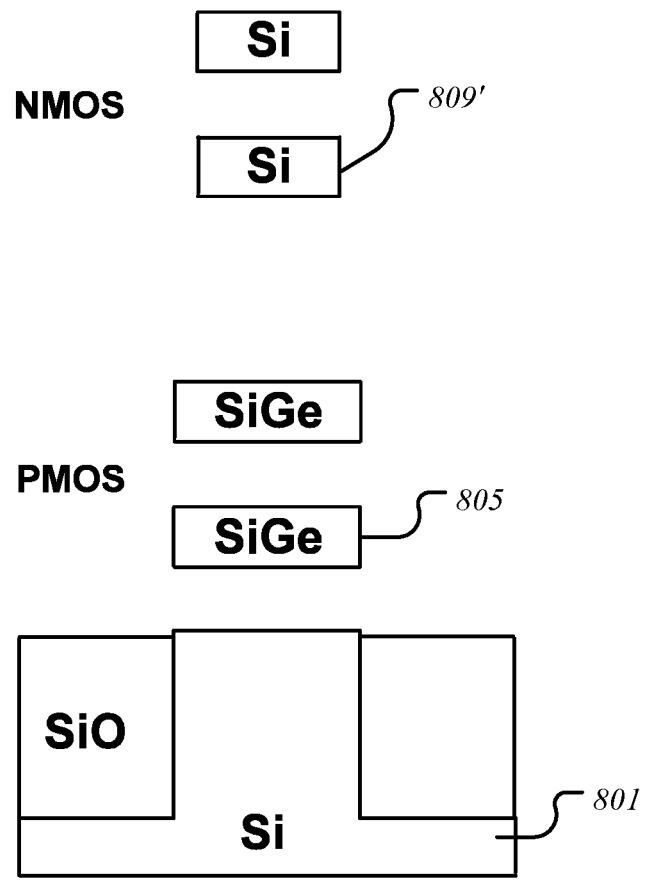
FIG. 10 shows a cross-sectional view of a fin structure with two different channel materials, wherein bulk fin material has been removed according to an embodiment of the disclosure.

After etching of one or both (or more) channel materials, bulk fin material 807 can then be removed to uncover the regions 810, 820. Bulk fin material 807 can be removed in sections that are uncovered so that nanowires or nanosheets are supported at each end. FIG. 10 illustrates an example result. Such bulk fin material removal can also be executed in a same processing chamber such as a chamber/system that uses vapor-phase etching.

Figure 11:
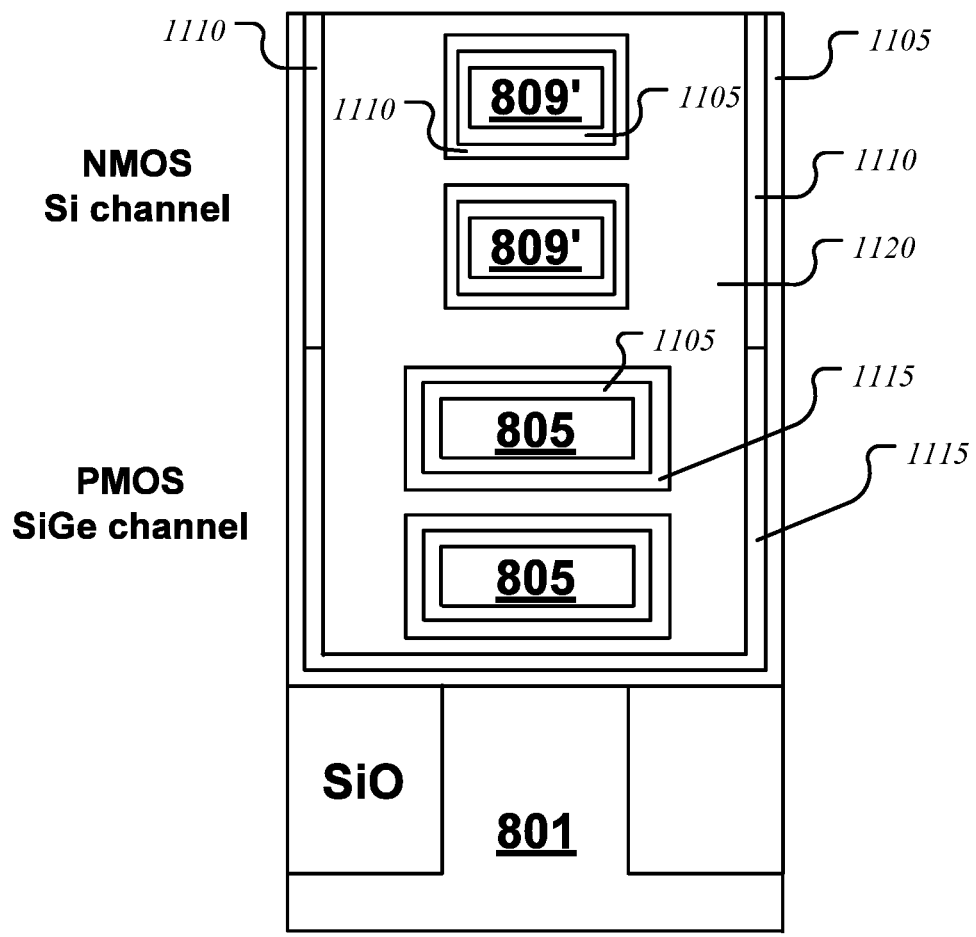
FIG. 11 shows a gate all around transistor device with two different channel materials according to an embodiment of the disclosure.

As illustrated in FIG. 11, after removal of the bulk fin material, processing can continue to form gate-all-around (GAA) channels such as by depositing high-k dielectric 1105, NMOS work-function metal 1110, PMOS work-function metal 1115, and gate fill metal 1120. Notably, FIG. 11 illustrates how difficult Vt tuning can be through work function metal thickness reduction for a stacked device where PMOS and NMOS are overtop one another. It becomes difficult for stacked devices utilizing wide nanowire/nanosheet structures to remove the same amount of metal from the sides of the wires or sheets than in the center-bottom or center-top of the sheets, especially when there are other sheets either above or below. Therefore, the disclosed method of Vt tuning may be achieved through changing the channel volume as opposed to changing the work function metal thickness for individual transistors.

Such a trimming technique described herein enables tuning of one or both channel materials to precisely modify transistor delay or Vt in FET devices including 3D CFET devices. It can be appreciated by those in the art that the aforementioned descriptions may lean towards describing adjusting transistor delay, but that a desired predetermined threshold voltage tuning can be targeted for adjustment instead of transistor delay in determining channel volume reductions.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method of manufacturing a semiconductor device comprising:
   providing a substrate comprising:
      a first stacked fin structure for forming a channel of a first gate-all-around (GAA) transistor, the first stacked fin structure comprising an initial volume of first channel material provided between upper and lower portions of first sacrificial material such that the first channel material and first sacrificial material are exposed at a side of the first stacked fin structure, and
      a second stacked fin structure for forming a channel of a second GAA transistor, the second stacked fin structure comprising an initial volume of second channel material provided between upper and lower portions of second sacrificial material such that the second channel material and second sacrificial material are exposed at a side of the second stacked fin structure;
   masking sidewalls of the first stacked fin structure;
   reducing, after the masking, said initial volume of the second channel material relative to the initial volume of first channel material by a predetermined amount corresponding to a delay of the first GAA transistor via etching the second stacked fin structure to trim the initial volume of the second channel material to a trimmed volume corresponding to a predetermined delay of the second GAA transistor; and
   forming first and second GAA gate structures around said first channel material and said second channel material respectively.

2. The method of claim 1, wherein said second stacked fin structure is stacked over the first stacked fin structure within a common base fin structure.

3. The method of claim 2, wherein said first channel material has a same chemical composition as that of said second channel material.

4. The method of claim 2, further comprising providing a predetermined thickness of sacrificial separation material between the first stacked fin structure and the second stacked fin structure, the predetermined thickness being selected to provide process tolerance for masking the first stacked fin structure.

5. The method of claim 4, wherein said predetermined thickness of sacrificial material is greater than 10 nm.

6. The method of claim 2, wherein:
   said first channel material has a chemical composition different from a chemical composition of the second channel material, and said reducing comprising exposing the first and second stacked channel structures to an isotropic etch process which selectively etches the second channel material relative to the first channel material.

7. The method of claim 1, wherein said first stacked fin structure is provided within a first base fin structure and said second stacked fin structure is provided within in a second base fin structure laterally spaced from the first base fin structure along said planar surface of the substrate.

8. The method of claim 7, wherein said reducing comprises:
masking said first base fin structure, and
etching the second base fin structure reduce the initial volume of the second channel material.

9. The method of claim 1, wherein said first stacked fin structure is stacked over the second stacked fin structure within a common base fin structure.

10. The method of claim 1, wherein
the first stacked fin structure is stacked over the second stacked fin structure within a common base fin structure, and
the first stacked fin structure is masked via deposition of a masking material using an angled deposition.

11. The method of claim 10, further comprising:
at least one adjacent masking structure, wherein
a shadow of the at least one adjacent masking structure prevents deposition of the masking material on the second stacked fin structure during the angled deposition.

12. A method of manufacturing a semiconductor device comprising:
providing a substrate comprising:
a first stacked fin structure for forming a channel of a first gate-all-around (GAA) transistor, the first stacked fin structure comprising an initial volume of first channel material provided between upper and lower portions of first sacrificial material such that the first channel material and first sacrificial material are exposed at a side of the first stacked fin structure, and
a second stacked fin structure for forming a channel of a second GAA transistor, the second stacked fin structure comprising an initial volume of second channel material provided between upper and lower portions of second sacrificial material such that the second channel material and second sacrificial material are exposed at a side of the second stacked fin structure;
masking sidewalls of the first stacked fin structure;
reducing, after the masking, said initial volume of the second channel material relative to the initial volume of first channel material by a predetermined amount corresponding to a threshold voltage of the first GAA transistor via etching the second stacked fin structure to trim the initial volume of the second channel material to a trimmed volume corresponding to a predetermined delay of the second GAA transistor; and
forming first and second GAA gate structures around said first channel material and said second channel material respectively.

13. The method of claim 12, wherein said second stacked fin structure is stacked over the first stacked fin structure within a common base fin structure.

14. The method of claim 12, further comprising providing a predetermined thickness of sacrificial separation material between the first stacked fin structure and the second stacked fin structure, the predetermined thickness being selected to provide process tolerance for masking the first stacked fin structure.

15. The method of claim 12, wherein
the first stacked fin structure is stacked over the second stacked fin structure within a common base fin structure, and
the first stacked fin structure is masked via deposition of a masking material using an angled deposition.

16. The method of claim 15, further comprising:
at least one adjacent masking structure, wherein
a shadow of the at least one adjacent masking structure prevents deposition of the masking material on the second stacked fin structure during the angled deposition.

* * * * *